Dec. 1, 1959 W. D. FRAZIER ET AL 2,915,678

ELECTRICAL MOUNTING DEVICES

Filed June 14, 1955

WILLIAM E. WIBELEY
WILLIAM D. FRAZIER
INVENTORS

BY Henry Heyman

ATTORNEY 2,915,678
Patented Dec. 1, 1959

2,915,678

ELECTRICAL MOUNTING DEVICES

William Douglas Frazier, Wichita, Kans., and William E. Wiseley, Inglewood, Calif., assignors to Hughes Aircraft Company, Culver City, Calif., a corporation of Delaware Application June 14, 1955, Serial No. 515,325
2 Claims. (Cl. 317—101)

This invention relates to electrical mounting devices, and particularly to devices for mounting electrical components in a circuit board.

Mechanically assembled circuits, such as printed circuits and etched wiring boards, are being increasingly used in modern electrical manufacture. The manner in which electrical components are mounted in such circuits is often critical to the successful operation of the assembly. The process of mounting of the electrical components should be as rapid, economical, and simple as practicable, while at the same time providing a structure of high reliability and uniformity. For economy and compactness, such mechanically assembled circuits are preferably of small size. Miniaturization of such structures, however, increases the difficulties encountered in assembly and operation. The devices of the prior art have not heretofore provided small mountings which uniformly hold electrical components in place securely despite mechanical abuse and a wide range of temperature variations.

It is therefore an object of this invention to provide an improved device for mounting electrical components in a circuit board.

Another object of this invention is to provide a small, but inexpensive and reliable, device for affixing electrical components to a printed circuit or etched wiring board.

A further object of this invention is to provide an improved device by which electrical components may be soldered to a circuit board more uniformly and reliably than was heretofore possible.

Another object of this invention is to provide an improved method, more economical and reliable than methods heretofore available, for affixing electrical components to a circuit board.

In accordance with this invention, an electrical component is quickly and reliably attached to a circuit board by the use of a novel eyelet form. The circuit board may be part of an assembly which includes printed wiring and may have apertures at selected points. Circuit pads, to which leads from electrical components are to be attached, may form the part of the wiring at the apertures. To mechanically and electrically couple the lead from an electrical component to a circuit pad, an eyelet member is inserted within the circuit pad. The eyelet member may have one flared end of a diameter greater than the inner diameter of the circuit pad. When the eyelet is in place, the remaining end may be flared, thus restraining the eyelet from movement with relation to the circuit pad. The ends or tips of the eyelet are so flared as to be spaced apart from the circuit pad. The lead from an electrical component may be inserted into the eyelet, the electrical component held in place, and the assembly soldered, as by a dip-solder process. The eyelet arrangement provides a uniform solder joint having a smooth and extensive contact area with both the electrical component and the circuit pad, and which provides the desired mechanical and electrical couplings.

The novel features of the invention, as well as the invention itself, both as to its organization and method of operation, may best be understood from the following description, when read in connection with the accompanying drawings, in which like designations refer to like parts and in which.

Figure 2:
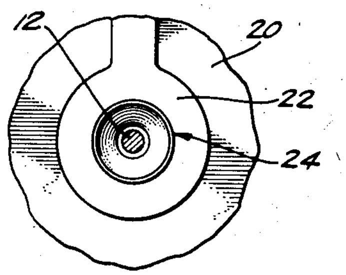
Fig. 2 is a plan view of the arrangement of Fig. 1, taken along section line 2—2 of Fig. 1 and looking in the direction of the appended arrows.
Figure 4:
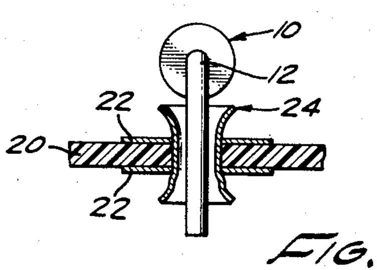
Figure 5:
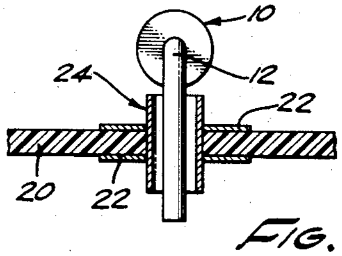
Figure 3:
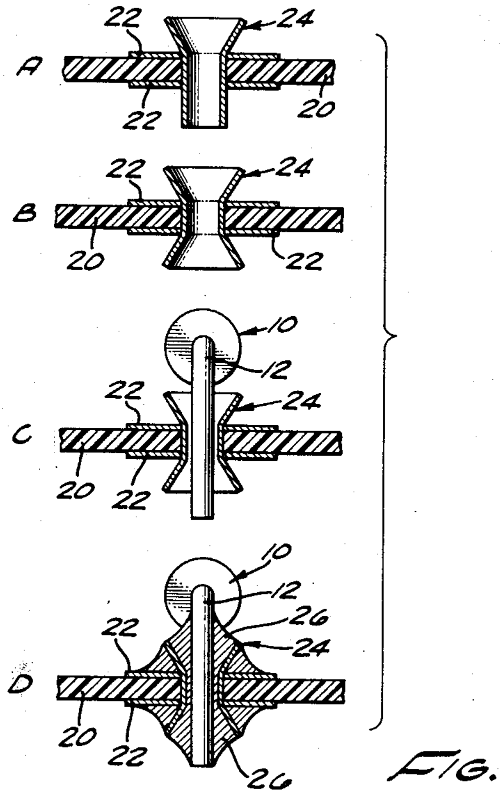
Figure 6:
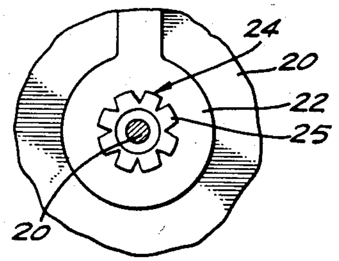
Figure 7:
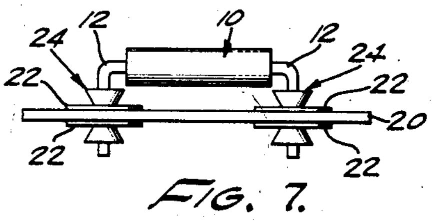

Fig. 3, comprising views A to D inclusive, is a representation of the steps of a method in accordance with the invention which may be employed for mounting electrical components;

Fig. 4 is a side sectional view of a second arrangement for practicing the invention;

Fig. 5 is a side sectional view of a third arrangement for practicing the invention;

Fig. 6 is a plan view, similar to Fig. 2, showing a technique which may be employed in flaring an eyelet member, and Fig. 7 is a side view of an assembly in accordance with the invention, prior to soldering.

Figure 1:
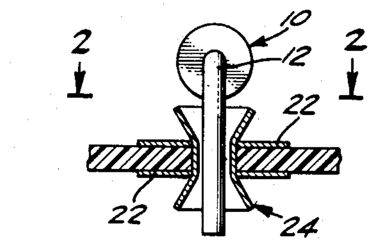
Fig. 1 is a side sectional view of one arrangement for practicing the invention.

An arrangement for practicing the invention, referring now to Figs. 1 and 2, may be employed to affix an electrical component 10 to a dielectric or nonconductive circuit board 20. The electrical component 10 may be a capacitor, resistor, or other component employed in the circuit assembly. The electrical component 10 may include a terminal lead 12 which is to provide both mechanical and electrical coupling for the component 10. The circuit board 20 may have apertures at various points, to which apertures the leads 12 from the electrical components 10 are to be attached. Conductive circuit material, such as a printed or etched circuit pad 22, may surround each aperture and provide electrical coupling to the pads of other apertures and their associated components. The conductive material may be applied to both sides of the board 20 and the board 20 may then be drilled to provide an aperture of the form shown in the figures. If a hole is made in the board 20 prior to application of a circuit pad 22, the circuit pad 22 may also be coated or deposited on the internal surfaces of the board.

An eyelet 24 made with conductive material may be fixed within the aperture defined by the circuit pad 22, to provide a means for simple and reliable attachment of the component lead 12 to the circuit pad 22. The eyelet 24 may have a narrow central portion fitting within the circuit pad 22, and flared or expanded end portions extending outwardly from the centerline of the aperture. The flared portions may be so formed as to lightly restrain the eyelet 24 from movement with respect to the circuit pad 22. It is desirable that this crimping, or clinching, force exerted by the eyelet 24 be small enough to avoid possible damage to the circuit pad 22. The tips of the end portions of the eyelet 24 are spaced apart from the circuit pad 22, and not bent or pressed flat against the circuit pad 22 as in the devices of the prior art.

Fig. 3 shows successive stages of the attachment of a component 10 by its lead 12 to a circuit bord 20. An eyelet 24 having one flared end is placed within the aperture defined by a circuit pad 22 in the board 20. In this position, shown at A in Fig. 3, the flared end of the eyelet 24 prevents the eyelet 24 from slipping through the aperture in the circuit pad 22. The next step is the flaring or expansion of the previously narrow end of the eyelet 24. This flaring may be accomplished by any of several well known means, as by restraining the upper end of the eyelet 24 by an anvil member, and by forcibly inserting a wedge or pointed member in the previously unflared end. The force applied should be sufficient to expand the end of the eyelet 24 toward the circuit pad 22 and to clinch the eyelet 24 from movement with respect to the circuit pad 22. The bases of the flared portions of the eyelet 24 provide most of the light crimping force. The eyelet 24 is thus fixed in position, as shown at B in Fig. 3. The lead 12 from an electrical component 10 may then be inserted within the eyelet 24, as at B in Fig. 3 and as in Fig. 7. The component 10 may then be held in a fixed relation to the circuit board 20 in preparation for a solder dipping process. The necessary relationship may be maintained, for example, by a sponge rubber pad fitted over the top of the component 10 to hold the component 10 against the circuit board 20. Dipping of the assembly in the solder bath will then provide a solder connection 26 as shown at D in Fig. 3. Note that the solder has considerable contact area with both the lead 12 of the component 10 and the circuit pad 22. The spacing of the tips of the eyelet 24 provides easy access for the solder to both the lead 12 and the circuit pad 22. No small air gaps exist to cause imperfections due to the surface tension of the solder. Thus, uniform contacts having considerable solder area are provided, without requiring an increase in the size of the circuit pads employed. Further, the dimensions of the eyelet are not critical. A hand solder or other coupling process may be employed in place of the dip solder if desired.

A second arrangement for affixing a component 10 to a circuit board 20 is shown in Fig. 4. In this arrangement, the eyelet 24, as shown, may have a curved upper end, rather than the angular shape provided in Fig. 1. Expansion of the lower end, viewed as in Fig. 4, of the eyelet 24 may provide a flange portion acting to hold the eyelet 24 against the circuit pad 22. The operative effect is, however, similar to that of the arrangement of Fig. 1. This arrangement may be practiced with types of commercially available eyelets having one flared end of curved cross section.

A third arrangement which may be employed where circumstances provide greater convenience is shown in Fig. 5. In this arrangement neither end of the eyelet 24 is flared, but the eyelet 24 is made larger than the aperture and is inserted within the circuit pad 22 with a press fit. Again, the relationship of the eyelet 24 to the lead 12 and the circuit pad 22 provides a solder disposition similar to the solder 26 shown at D of Fig. 3.

If desired, flared ends of the eyelets 24 may be split into individual leaves 25, as shown in Fig. 6. The space between the leaves permits easier solder flow, and assures solder interlocking, thus facilitating fabrication of uniform contacts having ample distributed solder.

Any of the forms illustrated are particularly suitable for use in miniaturized electrical assemblies, by virtue of the uniform and reliable mountings they provide. Structures having good electrical and mechanical couplings, which are capable of withstanding extreme variations of temperature, have been provided, for example, with circuit boards approximately 0.062″ thick, having hole diameters of approximately 0.050″, together with eyelets approximately 0.095″ high. Although eyelet flange angles of approximately 45° are illustrated in Figs. 1 and 3, it will be apparent that other angles may be used where desired.

Thus there has been described a simple and economical method of and means for mounting electrical components in a circuit board. The leads of electrical components may be affixed to mechanically assembled circuits by a structure having strength and mechanical rigidity, and good electrical conductivity and uniformity.

What is claimed is:

1. A circuit assembly comprising a circuit board having an aperture therein, conductive circuit pad surfaces mounted on each side of said board about said aperture, an eyelet member having a cylindrical central portion within said aperture and flared end portions extending outwardly at approximately a 45° angle from said central portion, the bases of said flared end portions being positioned such as to restrain said eyelet member from movement relative to said circuit pad, an electrical component having an external lead, said external lead being positioned within said eyelet member, and a solder coupling affixing said external lead to said eyelet member and said circuit pad.

2. A circuit assembly comprising a circuit board having an aperture therein, conductive circuit pad surfaces mounted on each side of said board about said aperture, an eyelet member having a cylindrical central portion within said aperture and end portions flared outwardly from said central portion to restrain said eyelet member from movement relative to said circuit pad, each of said end portions comprising a plurality of individual leaves, the tips of said leaves being spaced apart from said circuit pad surfaces, an electrical component having an external lead, said external lead being positioned within said eyelet member, and a solder coupling affixing said external lead to said eyelet member and said circuit pad.

References Cited in the file of this patent

UNITED STATES PATENTS

| | | |
|---|---|---|
| 2,270,166 | Hiensch | Jan. 13, 1942 |
| 2,694,249 | Kapp | Nov. 16, 1954 |
| 2,700,150 | Wales | Jan. 18, 1955 |
| 2,756,485 | Abramson | July 31, 1956 |

FOREIGN PATENTS

| | | |
|---|---|---|
| 649,254 | Great Britain | Jan. 24, 1951 |